(12) United States Patent
Harris et al.

(10) Patent No.: US 6,798,312 B1
(45) Date of Patent: Sep. 28, 2004

(54) MICROELECTROMECHANICAL SYSTEM (MEMS) ANALOG ELECTRICAL ISOLATOR

(75) Inventors: Richard D. Harris, Solon, OH (US); Michael J. Knieser, Richmond Heights, OH (US); Ernst H. Dummermuth, Chesterland, OH (US); Robert J. Kretschmann, Bay Village, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 608 days.

(21) Appl. No.: 09/804,817

(22) Filed: Mar. 13, 2001

Related U.S. Application Data

(63) Continuation-in-part of application No. 09/406,364, filed on Sep. 28, 1999, now Pat. No. 6,188,322, and a continuation-in-part of application No. 09/406,654, filed on Sep. 27, 1999, and a continuation-in-part of application No. 09/400,125, filed on Sep. 21, 1999.

(51) Int. Cl.[7] .............................. H01P 1/36; H01P 1/10
(52) U.S. Cl. ...................... 333/24.2; 333/105; 333/262; 333/17.1; 200/181; 310/309
(58) Field of Search ........................ 333/17.1, 26, 105, 333/262, 24.2; 200/181; 310/309

(56) References Cited

U.S. PATENT DOCUMENTS

| | | |
|---|---|---|
| 3,886,447 A | 5/1975 | Tanaka |
| 4,560,953 A | 12/1985 | Bozio |
| 5,012,207 A | 4/1991 | Edwards |
| 5,025,346 A | 6/1991 | Tang et al. |
| 5,194,819 A | 3/1993 | Briefer |
| 5,243,861 A | 9/1993 | Kloeck et al. |
| 5,343,157 A | 8/1994 | Deschamps |
| 5,359,893 A | 11/1994 | Dunn |
| 5,399,232 A | 3/1995 | Albrecht et al. |
| 5,413,668 A | 5/1995 | Aslam et al. |
| 5,417,312 A | 5/1995 | Tsuchitani et al. |
| 5,424,650 A | 6/1995 | Frick |
| 5,491,604 A | 2/1996 | Nguyen et al. |
| 5,536,988 A | 7/1996 | Zhang et al. |
| 5,563,343 A | 10/1996 | Shaw et al. |
| 5,572,057 A | 11/1996 | Yamamoto et al. |
| 5,578,528 A | 11/1996 | Wuu et al. |
| 5,578,976 A | 11/1996 | Yao |
| 5,585,311 A | 12/1996 | Ko |
| 5,600,190 A | 2/1997 | Zettler |
| 5,646,432 A | 7/1997 | Iwaki et al. |
| 5,658,698 A | 8/1997 | Yagi et al. |
| 5,723,353 A | 3/1998 | Muenzel et al. |

(List continued on next page.)

FOREIGN PATENT DOCUMENTS

| | | |
|---|---|---|
| EP | 0 665 590 A2 | 8/1995 |
| EP | 0 711 029 A2 | 5/1996 |
| EP | 0 763 844 A2 | 3/1997 |

OTHER PUBLICATIONS

Storment, C.W., et al. "Flexible, Dry–Released Process for Aluminum Electrostatic Actuators." Journal of Microelectromechanical Systems, 3(3), Sep. 1994, p 90–96.

(List continued on next page.)

Primary Examiner—Robert Pascal
Assistant Examiner—Kimberly Glenn
(74) Attorney, Agent, or Firm—Quarles & Brady LLP; R. Scott Speroff

(57) ABSTRACT

A microelectromechanical system (MEMS) analog isolator may be created in which an actuator such as an electrostatic motor drives a beam against an opposing force set, for example, by another electrostatic motor. Motion of the beam may be sensed by a sensor also attached to the beam. The beam itself is electrically isolated between the locations of the actuator and the sensor. The structure may be incorporated into integrated circuits to provide on-chip isolation.

27 Claims, 5 Drawing Sheets

U.S. PATENT DOCUMENTS

| | | | |
|---|---|---|---|
| 5,761,350 | A | 6/1998 | Koh |
| 5,783,340 | A | 7/1998 | Farino et al. |
| 5,798,283 | A | 8/1998 | Montague et al. |
| 5,804,314 | A | 9/1998 | Field et al. |
| 5,815,051 | A | 9/1998 | Hamasaki et al. |
| 5,834,864 | A | 11/1998 | Hesterman et al. |
| 5,877,038 | A | 3/1999 | Coldren et al. |
| 5,903,380 | A | 5/1999 | Motamedi et al. |
| 5,920,978 | A | 7/1999 | Koshikawa et al. |
| 5,943,155 | A | 8/1999 | Goossen |
| 5,946,549 | A | 8/1999 | Itoigawa et al. |
| 5,955,932 | A | 9/1999 | Nguyen et al. |
| 5,959,516 | A | 9/1999 | Chang et al. |
| 5,995,688 | A | 11/1999 | Aksyuk et al. |
| 6,008,138 | A | 12/1999 | Laermer et al. |
| 6,046,066 | A | 4/2000 | Fang et al. |
| 6,060,336 | A | 5/2000 | Wan |
| 6,071,426 | A | 6/2000 | Lee et al. |
| 6,094,102 | A | 7/2000 | Chang et al. |
| 6,100,477 | A | 8/2000 | Randall et al. |
| 6,114,794 | A | 9/2000 | Dhuler et al. |
| 6,116,756 | A | 9/2000 | Peeters et al. |
| 6,127,767 | A | 10/2000 | Lee et al. |
| 6,137,206 | A | 10/2000 | Hill |
| 6,144,545 | A | 11/2000 | Lee et al. |
| 6,149,190 | A | 11/2000 | Galvin et al. |
| 6,159,385 | A | 12/2000 | Yao et al. |
| 6,170,332 | B1 | 1/2001 | MacDonald et al. |
| 6,188,322 | B1 | 2/2001 | Yao et al. |
| 6,232,150 | B1 | 5/2001 | Lin et al. |
| 6,232,841 | B1 | 5/2001 | Bartlett et al. |
| 6,232,847 | B1 | 5/2001 | Marcy, 5th et al. |
| 6,236,281 | B1 | 5/2001 | Nguyen et al. |
| 6,257,705 | B1 | 7/2001 | Silverbrook |
| 6,265,238 | B1 | 7/2001 | Yaji et al. |
| 6,276,205 | B1 | 8/2001 | McNie et al. |
| 6,307,169 | B1 | 10/2001 | Sun et al. |
| 6,316,278 | B1 | 11/2001 | Jacobsen et al. |
| 6,348,788 | B1 | 2/2002 | Yao et al. |
| 6,356,378 | B1 | 3/2002 | Huibers |
| 6,356,689 | B1 | 3/2002 | Greywall |
| 6,369,931 | B1 | 4/2002 | Funk et al. |
| 6,373,682 | B1 | 4/2002 | Goodwin-Johansson |
| 6,384,353 | B1 | 5/2002 | Huang et al. |
| 6,391,742 | B2 | 5/2002 | Kawai |
| 6,400,009 | B1 | 6/2002 | Bishop et al. |
| 6,411,214 | B1 | 6/2002 | Yao et al. |
| 6,417,743 | B1 | 7/2002 | Mihailovich et al. |
| 6,428,713 | B1 | 8/2002 | Christenson et al. |
| 6,463,339 | B1 | 10/2002 | Vasko |
| 6,465,929 | B1 | 10/2002 | Levitan et al. |
| 6,466,005 | B1 | 10/2002 | Yao et al. |
| 6,497,141 | B1 | 12/2002 | Turner et al. |
| 6,504,356 | B2 | 1/2003 | Yao et al. |
| 6,547,973 | B2 | 4/2003 | Field |
| 6,583,374 | B2 * | 6/2003 | Knieser et al. ............. 200/181 |
| 2002/0017132 | A1 | 2/2002 | McNie et al. |
| 2002/0021119 | A1 | 2/2002 | Yao et al. |
| 2002/0158039 | A1 | 10/2002 | Harris et al. |

OTHER PUBLICATIONS

Boser, Bernhard E., et al., Surface Micromachined Accelerometers, IEEE J. of Solid–State Circuits, V. 31 (3) 366–375, Mar. 1996.

Fedder, Gary K. et al., Multimode Digital Control of a Suspended Polysilicon Microstructure, J. of Microelectromechanical Sys., V. 5(4) 283–297, Dec. 1996.

Norlega, Gerardo, Sigma–Delta A/D Converters–Audio and Medium Bandwidths, Technical Notes–DT3 from RMS Instruments website: www.rmsinst.com, 6 pages, Feb. 1996.

Internet page: Decimator Filter DLL, NeuroDimension Inc.: www.nd.com , May 31, 2001.

Toumazou, C. et al., n–step Charge Injection Cancellation Scheme for Very Accurate Switched Current Circuits, Electronic Letters, V.30 (9) 680–681: 1994.

Emmerich, H., et al., A Novel Micromachined Magnetic–Field Sensor, MEMS 99 IEEE Conference, Jan. 17–21, 1999, IEEE Catalog No. 99ch36291c.

Madou, Marc, Fundamentals of Microfabrication, Chapters 2–4, CRC Press LLC, Boca Raton, FL: 1997.

Kovacs, Gregory T.A., Micromachined Transducers Sourcebook, Table of Contents, pp. 77–119 and Index, WCB McGraw–Hill, U.S.A.: 1998.

Teegarden, Darrell et al., How to Model and Simulate Microgyroscope Systems, IEEE Spectrum, 66–75, Jul. 1998.

Emmerich, Harald et al., Magnetic Field Measurements with a Novel Surface Micromachined Magnetic–Field Sensor, IEEE Transactions on Electron Devices, V. 47 (5) 972–977, May 2000.

McGruer, N.E. et al., Electrostatically Actuated Microswitches; Scaling Properties, Solid–State Sensor and Actuator Workshop, Hilton Head Island, South Carolina, Jun. 8–11, 1998, pp. 132–135.

Miyajima, Hiroshi et al., High–Aspect–Ratio Photolithography for MEMS Applications, J. of Microelectromechanical Sys., V.4(4) 220–229, Dec. 1995.

Lu, Crist et al., A Monolithic Surface Micromachined Accelerometer with Digital Output, IEEE J. of Solid State Circuits, V. 30 (12) 1367–1373, Dec. 1995.

Chen, Ming–Jer et al., Weak Inversion Charge Injection in Analog MOS Switches, IEEE J. of Solid–State Circuits, V. 30 (5) 604–606, May 1995.

Lemkin, Mark A. et al., A Fully Differential Lateral S? Accelerometer with Drift Cancellation Circuitry, Solid–State Sensor and Actuator Workshop, Hilton Head, South Carolina, Jun. 2–6, 1996, pp. 90–93.

U.S. patent application No.: 09/406,654, filed on Sep. 27, 1999.

U.S. patent application No.: 09/400,125, filed on Sep. 21, 1999.

U.S. patent application No.: 09/406,509, filed on Sep. 28, 1999.

U.S. patent application No.: 09/955,493, filed on Sep. 18, 2001.

U.S. patent application No.: 09/955,494, filed on Sep. 18, 2001.

U.S. patent application No.: 09/675,861, filed on Sep. 29, 2000.

* cited by examiner

MICROELECTROMECHANICAL SYSTEM (MEMS) ANALOG ELECTRICAL ISOLATOR

CROSS-REFERENCE TO RELATED APPLICATIONS

This application is a continuation in part of U.S. patent application Ser. Nos. 09/406,364 filed Sep. 28, 1999, now U.S. Pat. No. 6,188,322; Ser. No. 09/406,654 filed Sep. 27, 1999 and Ser. No. 09/400,125 filed Sep. 21, 1999.

FIELD OF THE INVENTION

The present invention relates to electrical isolators and in particular to a microelectromechanical system (MEMS) device providing electrical isolation in the transmission of analog electrical signals.

BACKGROUND OF THE INVENTION

Electrical isolators are used to provide electrical isolation between circuit elements for the purposes of voltage level shifting, electrical noise reduction, and high voltage and current protection.

Circuit elements may be considered electrically isolated if there is no path in which a direct current (DC) can flow between them. Isolation of this kind can be obtained by capacitive or inductive coupling. In capacitive coupling, an electrical input signal is applied to one plate of a capacitor to transmit an electrostatic signal across an insulating dielectric to a second plate at which an output signal is developed. In inductive coupling, an electrical input signal is applied to a first coil to transmit an electromagnetic field across an insulating gap to a second coil, which generates the isolated output signal. Both such isolators essentially block steady state or DC electrical signals.

Such isolators, although simple, block the communication of signals that have significant low frequency components. Further, these isolators can introduce significant frequency dependent attenuation and phase distortion in the transmitted signal. These features make such isolators unsuitable for many types of signals including many types of high-speed digital communications.

In addition, it is sometimes desirable to provide high voltage (>2 kV) isolation between two different portions of a system, while maintaining a communication path between these two portions. This is often true in industrial control applications where it is desirable to isolate the sensor/actuator portions from the control portions of the overall system. It is also applicable to medical instrumentation systems, where it is desirable to isolate the patient from the voltages and currents within the instrumentation.

The isolation of digital signals is frequently provided by optical isolators. In an optical isolator, an input signal drives a light source, typically a light emitting diode (LED) positioned to transmit its light to a photodiode or phototransistor through an insulating but transparent separator. Such a system will readily transmit a binary signal of arbitrary frequency without the distortion and attenuation introduced by capacitors and inductors. The optical isolator further provides an inherent signal limiting in the output through saturation of the light receiver, and signal thresholding in the input, by virtue of the intrinsic LED forward bias voltage.

Nevertheless, optical isolators have some disadvantages. They require a relatively expensive gallium arsenide (GaAs) substrate that is incompatible with other types of integrated circuitry and thus optical isolators often require separate packaging and assembly from the circuits they are protecting. The characteristics of the LED and photodetector can be difficult to control during fabrication, increasing the costs if unit-to-unit variation cannot be tolerated. The power requirements of the LED may require signal conditioning of the input signal before an optical isolator can be used, imposing yet an additional cost. While the forward bias voltage of the LED provides an inherent noise thresholding, the threshold generally cannot be adjusted but is fixed by chemical properties of the LED materials. Accordingly, if different thresholds are required, additional signal conditioning may be needed. Finally, the LED is a diode and thus limits the input signal to a single polarity unless multiple LEDs are used.

It is common to process analog electrical signals using digital circuitry such as microprocessors. In such situations, the analog signal may be periodically sampled and the samples converted into digital words input by an analog to digital converter (A/D) to and processed by the digital circuitry. Conversely, digital words produced by the digital circuitry may be converted into an analog signal through the use of a digital-to-analog converter (D/A) to provide a series of analog electrical values that may be filtered into a continuous analog signal. Isolation of such signals at the interface to the digital circuitry is often desired and may be performed by placing an optical isolator in series with the electrical signal representing each bit of the relevant digital word after the A/D converter and before the DIA converter. Particularly in the area of industrial controls where many isolated analog signals must be processed and output, a large number of optical isolators are required rendering the isolation very costly or impractical.

BRIEF SUMMARY OF THE INVENTION

The present invention provides a mechanical isolator manufactured using MEMS techniques and suitable for transmitting analog signals without prior conversion to digital signals. A special fabrication process forms a microscopic beam whose ends are insulated from each other. One end of the beam is connected to a microscopic actuator, which receives an analog input signal to move the beam in proportion to a generated actuator force. The other isolated end of the beam is attached to a sensor detecting movement of the beam to provide a corresponding analog value. The small scale of the total device provides inexpensive, fast and reliable response.

Specifically, the present invention provides a microelectromechanical system (MEMS) analog isolator having a substrate and an element supported from the substrate for continuous movement between a first and second position with respect to the substrate, where at least a portion of the element between a first and second location on the element is an electrical insulator to electrically isolate the first and second locations from each other. An actuator attached to the first portion of the element receives an input electrical signal and exerts a force dependent on the input electrical signal urging the element toward the second position. A control device attached to the element to exert a force dependent on the displacement of the element toward the first position and a sensor assembly communicating with the second portion of the element provide an analog output electrical signal dependent on movement of the element between the first position and the second position.

It is one object of the invention to produce a simple mechanical isolation system using MEMS techniques suitable for direct isolation of an analog signal overcoming the need for many optical isolators and further avoiding many of the disadvantages of current optical isolators in costs, inter-device consistency, and incompatibility with other integrated circuit components. In addition, the present invention requires no preconditioning of the input signal. The input voltage, current, or mechanical displacement can be applied directly to the device with no pre-processing.

The control element may be a spring or its equivalent and the sensor assembly may include a sensor providing the analog output electrical signal based on the amount of movement of the element.

Thus another object of the invention is to provide the possibility of a simple open-loop analog isolator where the analog signal is transmitted over an insulated beam by motion of the beam.

Alternatively, the control element may be a second actuator attached to the element to receive a feedback electrical signal and exert a force dependent on the feedback electrical signal urging the element toward the first position. In this case, the sensor assembly may include a sensor indicating a location of the element with respect to a null position and an error detector receiving the output electrical signal to generate the feedback electrical signal so as to tend to restore the element to the null position. The output electrical signal is derived from the feedback signal.

Another object of the invention is thus to permit a more complex analog isolator using feedback techniques where the analog signal is transmitted as forces permitting minimal movement of the beam thus avoiding mechanical non-linearities.

The control element may further include a third actuator attached to the element to receive a second feedback signal and exert a force dependent on the second feedback electrical signal urging the element toward the second position.

It is thus a further object of the invention to permit a feedback control of the beam allowing feedback signals that may exert either a force urging the element toward the first position or a force urging the element toward the second position.

The above described error detector may produce a binary electrical feedback signal indicating a position of the beam with respect to the null location between the first and second positions and further including a pulse width demodulator circuit evaluating the duty cycle of the feedback signal to produce the output electrical signal.

It is thus another object of the invention to provide a simple method of extracting a multi-bit digital signal from the isolator of the present invention. The duty cycle demodulator may be a simple counting circuit.

The actuator may be an electrostatic motor or a Lorenz-force motor or a piezoelectric motor or a thermal-expansion motor or a mechanical-displacement motor.

It is therefore another object of the invention to provide an isolator that may receive a variety of different electrical signals that may not be compatible with an optical isolator LED, for example, those having a voltage of less than 0.7 volts.

Similarly, the control element may be an electrostatic motor, a Lorenz-force motor, a piezoelectric motor, a thermal-expansion motor, a mechanical-displacement motor, or a mechanical spring.

Thus the invention may provide both for an extremely simple control element that requires no electrical connection (e.g. a mechanical spring) or an adjustable control element that allows the null point of the beam to be freely adjusted.

The sensor may be a capacitive sensor or a piezoelectric sensor or a photoelectric sensor or a resistive sensor or an optical switching sensor.

It is therefore another object of the invention to provide flexible variety of sensing techniques suitable for different purposes.

In one embodiment of the invention, the element may be a beam attached to the substrate for sliding motion between the first and second positions. The beam may be supported by flexing transverse arm pairs attached at longitudinally opposed ends of the beam to extend outward therefrom.

Thus it is another object of the invention to provide a simple mechanism that may be implemented on a microscopic scale using MEMS technologies for supporting the element for motion.

The flexing transverse arms may include a cantilevered first portion having first ends attached to the beam and second ends attached to an elbow portion removed from the beam and a cantilevered second portion substantially parallel to the first portion and having a first end attached to the substrate proximate to the beam and a second end attached to the elbow portion. Further the beam and the transverse arms may be symmetric across a longitudinal beam access.

Thus it is another object of the invention to provide a microscopic structure that is resistant to thermal expansion due to processing temperatures or to changes in the operating temperature. The symmetry ensures that the beam remains centered with thermal expansion while the doubling back of the flexible transverse arms provides for a degree of stress relief.

The flexing transverse arms may attach to the substrate through a spring section allowing angulations of the ends of the transverse arms with respect to the substrate.

It is thus another object of the invention to allow an effective pivoting of the flexible transverse arms so as to decrease the stiffness of the beam structure.

One embodiment of the invention may include a magnetic field, which may be produced by a magnet, crossing the beam and at least one flexing transverse arm may be conductive to an electrical signal and exert a force dependent on the electrical signal urging the beam toward a position.

It is thus another object of the invention to provide that the same structure used to support the beam may provide for its actuation or control.

The beam may include transverse extending primary capacitor plates attached to the beam and extending out from the beam proximate to secondary capacitor plates. The effective area of the primary capacitor plates may be equal across the longitudinal axis of the beam and the capacitor plates may be attached to the beam between attachment points of at least two of the flexing transverse arm pairs. In one embodiment, the capacitors may include interdigitated fingers. Parallel plate capacitors will also work (although they have less linearity).

Another object of the invention is to provide a method for the integration of an electrostatic motor to the isolator in a way that balanced and well-supported forces may be obtained.

The primary capacitor plates may be positioned with respect to the secondary capacitor plates so as to draw the primary capacitor plates toward the secondary capacitor plates on one side of the beam while to separate the primary capacitor plates from the secondary capacitor plates on the other side of the beam. Conversely, the capacitor plates may be positioned so that all draw together with a given motion.

Thus it is another object of the invention to allow the capacitor plates to be used as a sensor in which a comparison of capacitance values reveals a position of the beam or as an electrostatic motor.

The beam may include a first and second micro-machined layer, the first of which is insulating to provide the portion of the electrical insulator in a region where the second layer is removed.

Thus it is another object of the invention to provide a simple method for forming insulating and conductive elements required by the present invention.

The electrical insulator of the beam may be between the actuator and the control element or between the control element and the sensor or both.

It is further an object of the invention to provide that the controlling circuit may be placed on either side of the isolation or to provide redundant isolation for greater total isolation.

The analog isolator may include a second sensor at a first portion of the element to provide a second output electrical signal indicating movement of the element to the second position, the output second electrical signal being electrically isolated from the first output electrical signal.

Thus it is another object of the invention to provide for an isolator that produces a signal indicating movement of the beam and thus operation of the isolator from the isolated side.

The isolator may further include a second actuator as a second portion of the element to receive a second input signal and exert a force dependent on the second input electrical signal urging the element toward the second position.

Thus it is another object of the invention to provide for a bi-directional electrical isolator suitable for use in multi-level control loops or for the purpose of resetting a scaling factor.

The foregoing objects and advantages may not apply to all embodiments of the inventions and are not intended to define the scope of the invention, for which purpose claims are provided. In the following description, reference is made to the accompanying drawings, which form a part hereof, and in which there is shown by way of illustration, a preferred embodiment of the invention. Such embodiment also does not define the scope of the invention and reference must be made therefore to the claims for this purpose.

DETAILED DESCRIPTION OF THE INVENTION

Figure 1:
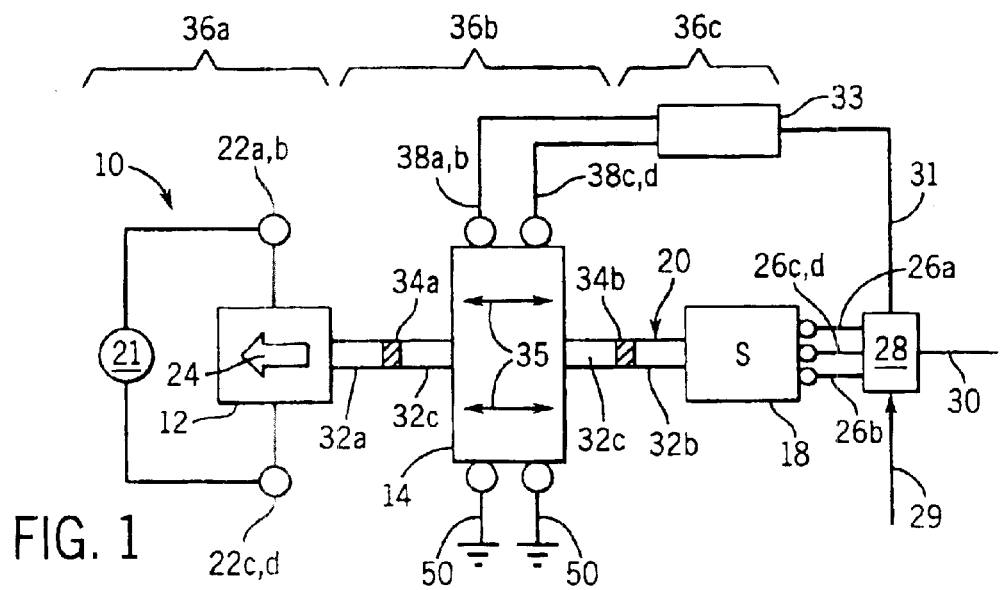
FIG. 1 is a simplified block diagram of the present analog isolator showing its elements of an actuator, a control element and a sensor communicating along a single mechanical element that may move to transmit data between the actuator and sensor and showing insulating portions of the moving element.

Referring now to FIG. 1, a MEMS analog isolator 10 per the present invention includes an actuator 12, control element 14, and a sensor 18 mechanically interconnected by a movable beam 20.

The actuator 12 includes terminals 22a and 22b and 22c+22d through which an analog electrical input signal 21 may be received and converted into a mechanical force tending to move the beam 20 in an actuation direction 24 indicated by an arrow. In the microscopic scale of the MEMS analog isolator 10, the actuator may be a piezoelectric actuator, a thermal-expansion motor, a mechanical-displacement motor, an electrostatic motor, or a Lorenz-force motor generally known in the art, the latter two to be described in more detail below. For a Lorenz-force motor or thermal-expansion motor, the analog electrical input signal 21 will be a current, for the piezoelectric or electrostatic motor, the input electrical signal will be a voltage.

The actuator 12 communicates with a first end of the beam 20. An opposite end of the beam 20 is received by the sensor 18 which detects movement of the beam 20 and through its terminals 26a and 26b and 26c+26d produces an electrical signal that may be measured directly or further processed by processing electronics 28 to produce the output signal 30 indicating movement of the beam 20. The sensor 18 maybe a piezoelectric-type sensor, a photoelectric sensor, a resistive sensor, an optical switching sensor, or a capacitive sensor according to techniques known in the art of MEMS design. In the preferred embodiment, the sensor 18 uses counterpoised movable plate capacitors as will be described in more detail below.

Attached to the beam 20 between the actuator 12 and the sensor 18 is the control element 14 which provides both a force on the beam 20 opposite the actuation direction 24 and tending to resist the operation of the actuator 12 or with the actuation direction 24 augmenting the operation of the actuator 12, as indicated by double headed arrows 35.

Absent an analog electrical input signal 21, the control element 14 may hold the beam 20 in a position toward the sensor 18. Ideally, the control element 14 provides a force that increases with motion of the beam 20 in the actuation direction 24. In this way, a simple relationship between actuation force and movement of the beam 20 is generated (e.g., with a simple spring-type system). The MEMS analog isolator 10 provides extremely low friction and inertia so this movement or force is consistent and rapid. Alternatively, the control element 14 may provide a rapidly increasing force (in a feedback system) arresting the movement of the beam 20 for any actuation force. Here the magnitude of the arresting force provides the output signal.

As described, the force provided by the control element 14 may be adjustable by varying a current or voltage to the structure and used in a feedback mode to essentially eliminate all but a small movement of the beam 20. Some movement of the beam 20 is necessary for the sensor 18 to provide the necessary countervailing feedback, but the movement may be reduced to an extent that non-linearities in the actuators and mechanical elements of the MEMS analog isolator 10, that might occur with more pronounced movement, are eliminated. Specifically, in this mode, the movement of the beam 20 is detected by processing electronics 28 to produce a position signal. The position signal is compared against a reference signal 29 to produce an error signal 31 which is directed to the control element to produce a restoring force returning the beam 20 to the null point. The connection between the error signal to the control element 14 may be direct or may be further modified by a feedback network 33 providing compensation for the system according to well-known feedback techniques. The feedback network 33 may steer voltage to either terminals 38c and 38d with a return at terminal 50 for actuation toward the sensor 18 or to terminals 38a and 38b with a return at terminal 50 for actuation toward the actuator 12 reflecting the fact that the electrostatic motors provide only a single direction of force.

The beam 20 includes conductive portions 32a and 32b, located at the actuator 12 and sensor 18, respectively, and such as may form part of the actuator 12 or sensor 18. Insulating portions 34a and 34b separate conductive portions 32a and 32b from a centermost conductive portion 32c that may be part of the control element 14; the insulating portions 34a and 34b thus defining three regions of isolation 36a–c. The first region 36a includes the actuator 12 and conductive portion 32a, the second region 36b includes the center conductive portion 32c and the control element 14, and the third region 36c includes the conductive portion 32b and sensor 18.

The insulated beam 20 provides a mechanism by which the analog electrical input signal 21 acting through the actuator 12 may produce a corresponding output signal 30 at the sensor 18 electrically isolated from the analog electrical input signal 21. The control element 14 may be electrically isolated from either the input signal and/or the output signal 30.

The control element 14 is preferably a Lorenz-force motor or an electrostatic motor of a type that will be described below. For the former of these two control elements, terminals 38a and 38b and return 50 are provided to provide a bi-directional current dictating the countervailing force provided by the control element 14. The direction of the current dictates the direction of the force. For the latter electrostatic structure, terminals 38a, 38b, 38c, and 38d are provided. Voltage is applied either to terminal pair 38a and 38b (with reference to return 50) or to terminal pair 38c and 38d (with respect to return 50) to determine the direction of the force.

Figure 2:
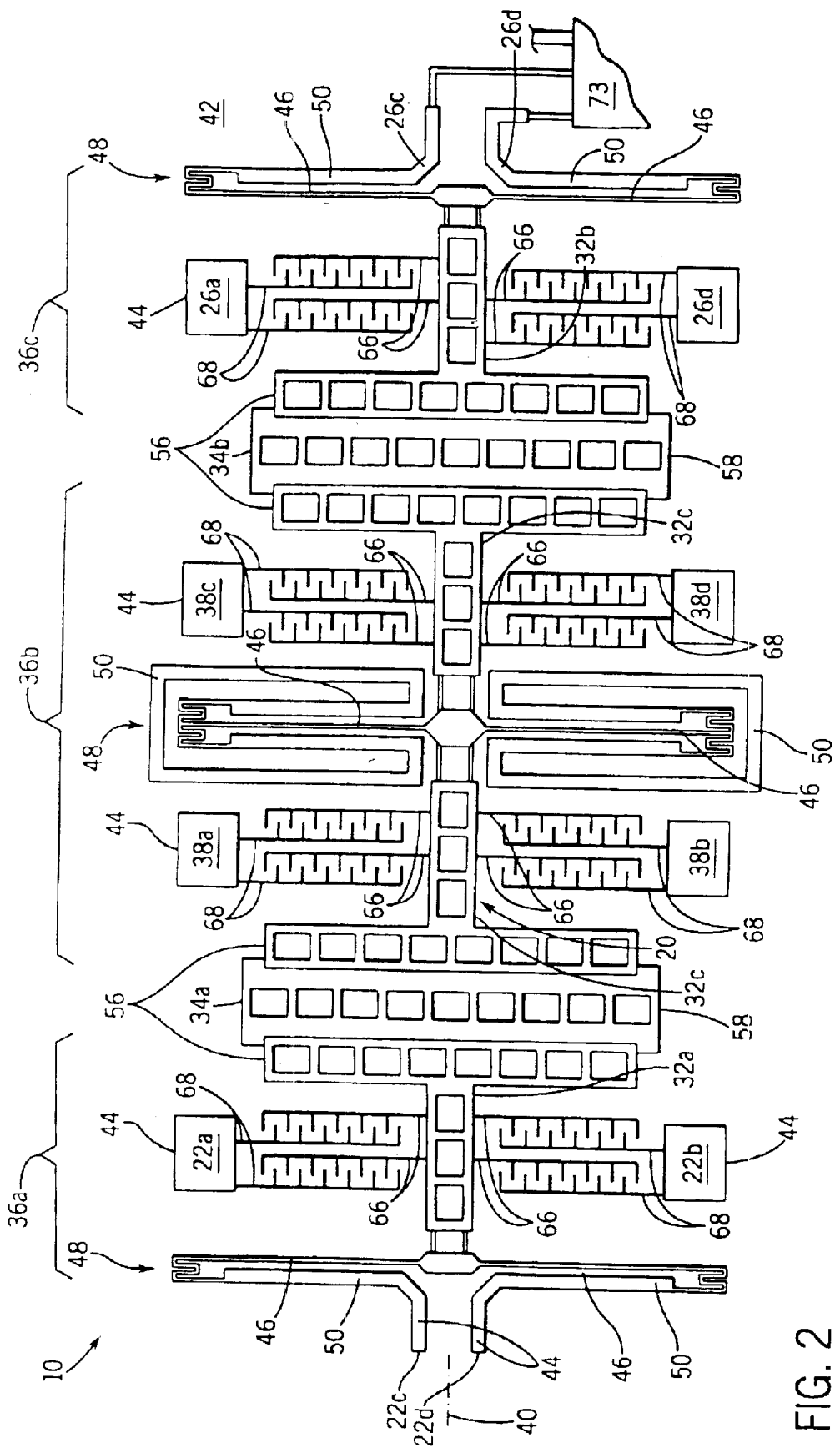
FIG. 2 is a top plan view of one embodiment of the isolator of FIG. 1 using three electrostatic motors and a capacitive sensor showing support of a moving beam connecting these components by means of flexible transverse arms and showing implementation of the insulating sections of the beam.

Referring now to FIG. 2, the beam 20 may extend above a substrate 42 along a longitudinal axis 40 passing along a midline between transversely opposed pylons 44 attached to a substrate 42. The pylons form the terminals 22a and 22b, 38a–38d, 26a, and 26b described above. Ideally, the substrate 42 is an insulating substrate and thus pylons 44 are all mutually isolated and particular conductive layers are placed or wire bonding used to make the necessary connections.

The beam 20 is supported away from the substrate 42 and held for movement along the longitudinal axis 40 by means of flexing arm pairs 46 extending transversely on opposite sides of both ends of the beam 20 and its middle. The flexing arms 46 extend away from the beam 20 to elbows 48 transversely removed from the beam 20 on each side of the beam 20. The elbows 48 in turn connect to expansion compensators 50, which return to be attached to the substrate 42 at a point near the beam 20. As mentioned above, these expansion compensators are not absolutely required. They serve as stress relief if that is needed. The flexing transverse arms 46 are generally parallel to the expansion compensators 50 to which they are connected. The flexing transverse arms 46, elbows 48 and expansion compensators are conductive to provide electrical connections between the conductive portions 32a, 32b, and 32c and stationary electrical terminals (not shown).

Figure 4:
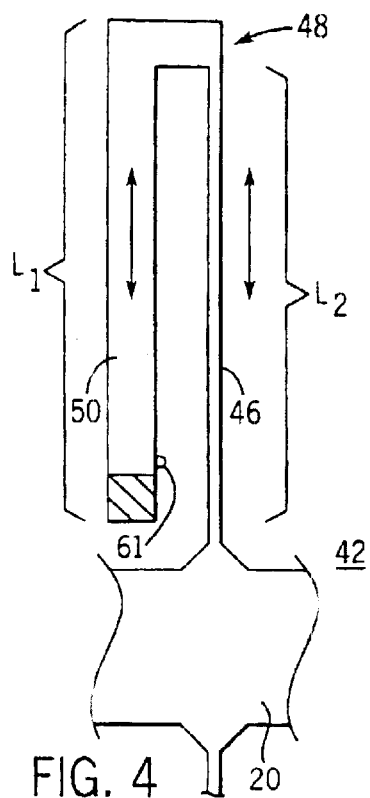
FIG. 4 is a fragmentary view of one transverse arm of FIG. 2 showing an optional doubling back of the arm at an elbow so as to provide stress relief.

Referring now to FIG. 4, the length $L_1$ of each expansion compensator 50 between its point of attachment 52 to the substrate 42 and its connection to a corresponding flexing transverse arm 46 at elbow 48 and the length $L_2$ of the flexing transverse arm 46 defined as the distance between its connection to beam 20 and the elbow 48 are set to be nearly equal so that expansion caused by thermal effects in the flexing transverse arm 46 is nearly or completely canceled by expansion in the expansion compensator 50. In this way, little tension or compression develops in the flexing transverse arm 46. Both the flexing transverse arm 46 and the expansion compensator 50 in this embodiment are fabricated of the same material, however it will be understood that different materials may also be used and lengths $L_1$ and $L_2$ adjusted to reflect the differences in thermal expansion coefficients. Note that a doubling back of the arm is not required. A straight connection will also work. The doubling back of the arm is a stress-relieving feature. Stress in the beam will affect the spring constant. Depending on the spring constant desired, and other geometric and process (e.g. substrate choice) considerations, stress relief may or may not be needed or desirable.

Figure 5A:
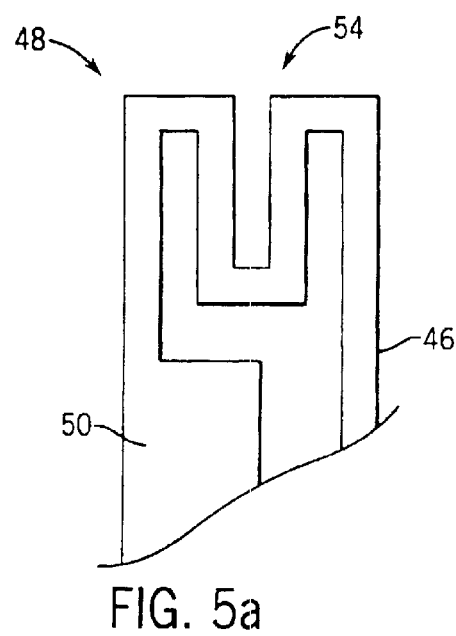
FIGS. 5a and 5b are fragmentary detailed views of the elbow of FIG. 4 showing the incorporation of a spring allowing angulation of the portion of the transverse arm attached to the beam for improved force characteristics.
Figure 5B:
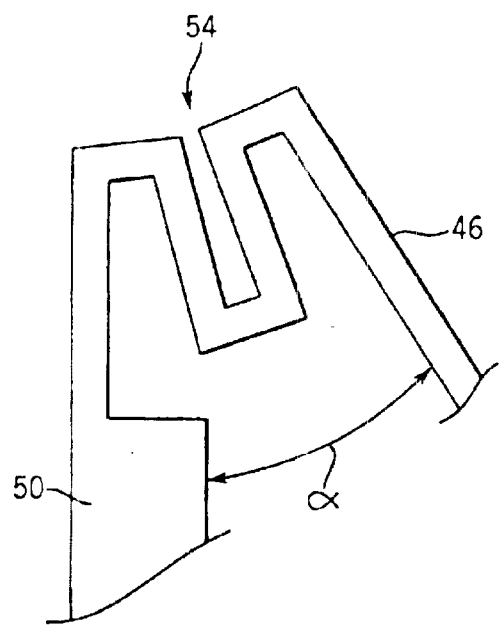

Referring to FIG. 5a, the elbow 48 may include a serpentine portion 54 extending longitudinally from the expansion compensator 50 to its flexing transverse arm 46. As shown in FIG. 5b, the serpentine portion 54 allow angulation a between the flexing transverse arm 46 and expansion compensator 50 such as provides essentially a radius adjusting pivot, both decreasing the force exerted by the flexing transverse arm pairs 46 on the beam 20 with movement of the beam 20 and decreasing the stiffness of the structure.

Figure 3:
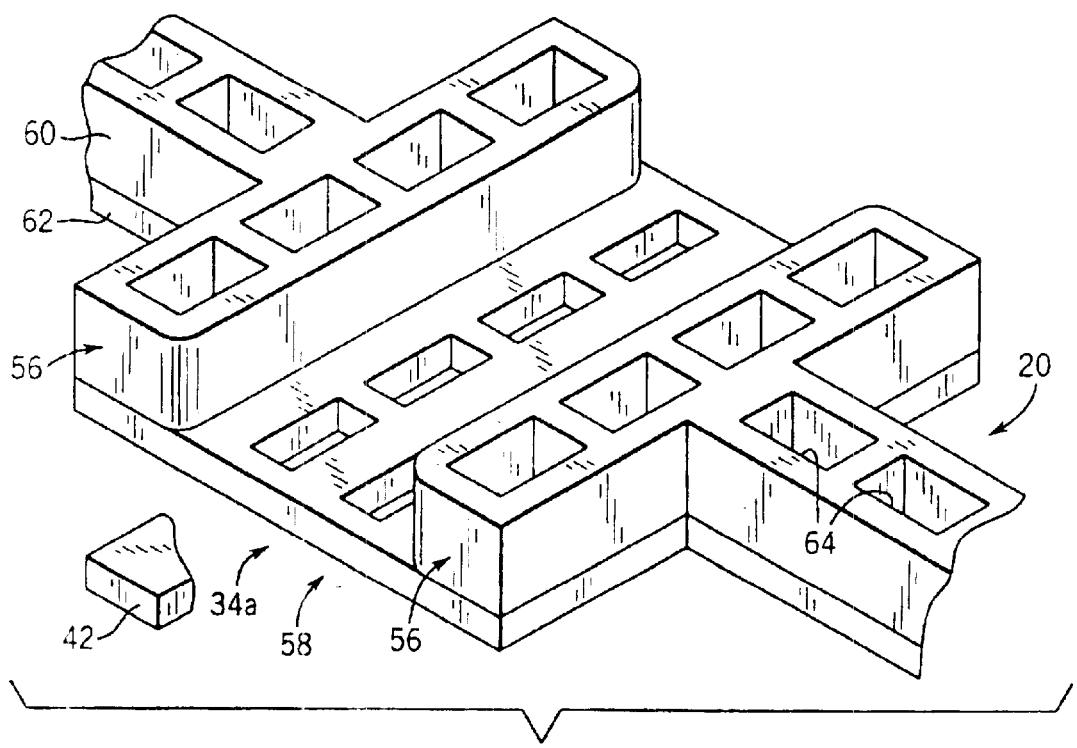
FIG. 3 is a simplified perspective view of an insulating section of the beam of FIG. 2 showing the use of laminated conductive and nonconductive layers and the removal of the conductive layer to create the insulating section.

Referring again to FIGS. 2 and 3, in between the flexing transverse arm pairs 46 the beam 20 expands to create T-bars 56 flanking insulating portion 34a and 34b. Insulating material 58 attached to these T-bars 56 create the insulating portions 34. Generally the beam 20 may be fabricated using well-known MEMS processing techniques to produce a structure suspended above the substrate 42 and composed of a laminated upper conductive layer 60 (for example polycrystalline silicon or crystalline silicon optionally with an upper aluminum layer) and a lower insulating layer 62 such as silicon dioxide or silicon nitride. The insulating portions 34 may be obtained simply by etching away the upper layer in the region 34a or 34b according to techniques well known in the art using selective etching techniques. An improved method of fabricating these structures is described in U.S. Pat. No. 6,159,385 issued Dec. 12, 2000 hereby incorporated by reference. The edges and corners of the T-bars 56 may be rounded to increase the breakdown voltage between them.

Each of the upper conductive layer 60 and lower insulating layer 62 are perforated by vertically extending channels 64 such as assists in conducting etchant beneath the layers 60 and 62 to remove a sacrificial layer that normally attaches layers 60 and 62 to the substrate 42 below according to techniques well known in the art.

Referring now to FIG. 2 again, portion 32a of the beam 20, such as provides a portion of the actuator 12 may have transversely outwardly extending, moving capacitor plates 66 overlapping with corresponding transversely inwardly extending stationary capacitor plates 68 attached to the pylons 44 representing terminals 22a and 22b. Each of the moving capacitor plates 66 and their corresponding stationary capacitor plates 68 may have mutually engaging fingers (as opposed to being simple parallel plate capacitors) so as to provide for a more uniform electrostatic force over a greater range of longitudinal travel of the beam 20. The thus formed electrostatic motor operates using the attraction between the capacitor plates 66 and 68 with the terminals 22b and 22a connected to a more positive voltage than that of beam 20 (connected to terminals 22c+22d), to urge the beam 20 in the actuation direction 24. For this reason, stationary capacitor plates 68 are after the moving capacitor plates 66 on both sides of the beam 20 as one travels along the actuation direction. Capacitor plates 66 and 68 are cantilevered over the substrate 42 by the same under etching used to free the beam 20 from the substrate 42.

The pylons 44 flanking portion 32c of the beam such as form pads 38a–38d likewise include moving and stationary capacitor plates 66 and 68 in two distinct pairs. As noted, this section provides the control element 14 and as such, two electrostatic motors; one (using terminals 38c and 38d) created to produce a force in the opposite direction of actuator 12 with the moving capacitor plates 66 following the stationary capacitor plates 68 as one moves in the actuation direction 24 and the other (using terminals 38a and 38b) created to produce a force in the same direction to the actuator 12 with the moving capacitor plates 66 preceding the stationary capacitor plates 68 as one moves in the actuation direction 24. These two actuators are used in combination to give the best possible control of the closed loop system.

Referring still to FIG. 2, portion 32b of the beam also supports moving capacitor plates 66 and stationary capacitor plates 68. However in this case, the capacitor plates do not serve the purpose of making an electrostatic motor but instead serve as a sensing means in which variation in the capacitance between the moving capacitor plates 66 and stationary capacitor plates 68 serves to indicate the position of the beam 20. In this regard, the order of the stationary and moving capacitor plates 66 and 68 is reversed on opposite sides of the beam 20. Thus, the moving capacitor plates 66 precede the stationary capacitor plates 68 on a first side of the beam (the upper side as depicted in FIG. 2) as one moves in the actuation direction 24 (as measured between terminal 26a and terminals 26c+26d) whereas the reverse order occurs on the lower side of the beam 20 (as measured between terminal 26b and terminals 26c+26d). Accordingly as the beam 20 moves in the actuation direction 24, the capacitance formed by the upper moving capacitor plates 66 and stationary capacitor plates 68 increases while the capacitance formed by the lower plates decreases. The point where the value of the upper capacitance crosses the value of the lower capacitance precisely defines a null point and is preferably set midway in the travel of the beam 20.

Techniques for comparing capacitance well known in the art may be used to evaluate the position of the beam 20. One circuit for providing extremely accurate measurements of these capacitances is described in co-pending application Ser. No. 09/677,037 filed Sep. 29, 2000, hereby incorporated by reference.

Generally, the operating structure of the MEMS analog isolator 10 is constructed to be symmetric about an axis through the middle of the beam 20 along the longitudinal axis 40 such as to better compensate the thermal expansions. In addition, the operating area of the plates of the capacitors, plates 66 and 68 on both sides of the beam 20 for the actuator 12 and the control element 14, are made equal so as to be balanced. For similar reasons, the capacitors of the electrostatic motors and the control element 14 are placed between flexing transverse arm pairs 46 so as to better control slight amounts of torsion caused by uneven forces between the capacitor plates 66 and 68.

Figure 6:
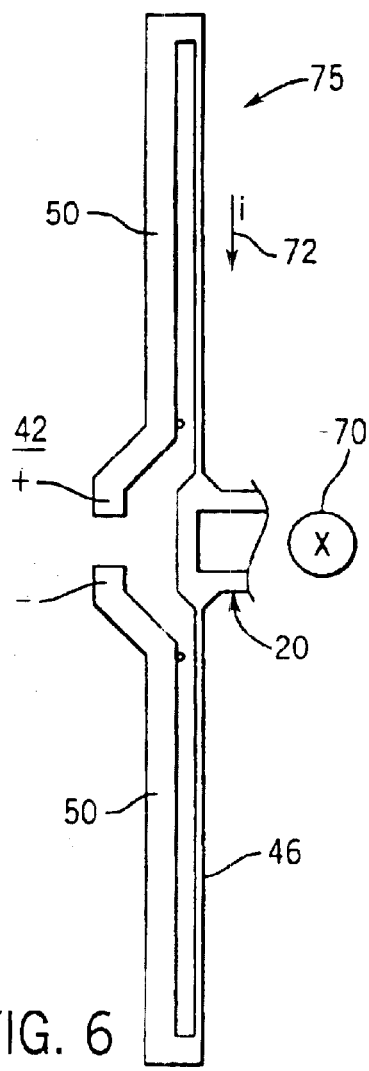
FIG. 6 is a view of one pair of transverse arms of FIG. 2 showing electrical separation of the arms of the pair to allow a current to be imposed on the arm to create a Lorenz-force motor such as may be substituted for the electrostatic motors of FIG. 2.

Referring now to FIG. 6, it will be understood that one or both of the electrostatic motors forming the actuator 12 and the control element 14 described above, may be replaced with Lorenz-force motors 75 in which forces are generated not by electrostatic attraction between capacitor plates but by the interaction of a current with a magnetic field. In the Lorenz-force motor 75, a magnetic field (e.g. with a permanent magnet, not shown) may be generated adjacent to the MEMS analog isolator 10 to produce a substrate-normal magnetic flux 70. The expansion compensators 50 supporting the flexing transverse arm 46 on opposite sides of the beam 20 are electrically isolated from each other so that a voltage may be developed across expansion compensators 50 to cause a current 72 to flow through the flexing transverse arm 46. This current flow in the magnetic field generated by the magnet will produce a longitudinal force on the beam 20 that may act in lieu of the electrostatic motors. The amount of deflection is generally determined by the flux density of the magnetic field 70, the amount of current and the flexibility of the flexing transverse arm pairs 46 in accordance with the right hand rule.

The Lorenz-force motors 75 are two quadrant, meaning they will accept currents in either direction to produce a force with or opposed to the actuation direction 24. Hence with Lorenz-force motors 75 (or the bi-directional electrostatic motor of the control element 14 described above), the MEMS analog isolator 10 may operate with two polarities unlike an optical isolator.

Figure 7:
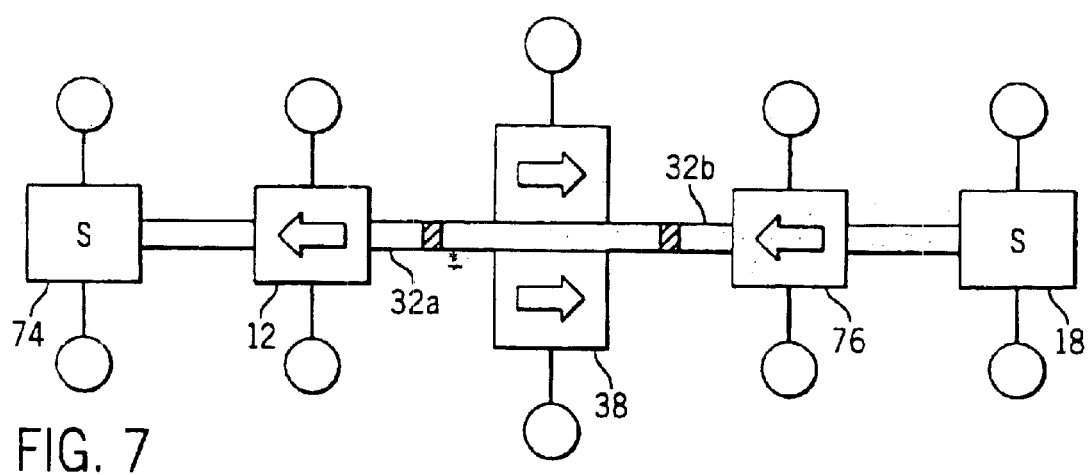
FIG. 7 is a figure similar to that of FIG. 1 showing the addition of a second sensor and second actuator on opposite ends of the beam to allow for a bi-directional isolator or with the additional sensor alone, a high reliability isolator.

Referring now to FIG. 7, the actuator 12 positioned on beam portion 32a, may be teamed with a second sensor 74 for sensing motion of the beam 20 and that sensor 74 may be used to provide isolated feedback to a device producing the analog electrical input signal 21 as to motion of the beam 20 such as may be used to ensure greater reliability in the transmission of signals.

Alternatively or in addition, the sensor 18 may be teamed with an actuator 76 having the same orientation of actuator 12 but positioned in isolation portion 32b. When actuator 76 is teamed with sensor 74, they together provide a bi-directional analog isolator in which isolated signals may be sent from either end of the beam 20 to the other end. It will be understood that another variation of this embodiment may eliminate the control element and instead the actuators 76 and 12 may be used during transmission by the other actuator as the control element. Such a device may be useful in some multi-loop analog system or for scaling adjustment.

It will be understood with greater circuit complexity that certain of the elements of the actuator 12, control element 14 and sensor 18 may be combined into individual structures and hence, these terms should be considered to cover the functional equivalents of the functions of actuator control element 14 and sensor 18 whether or not they are realized as individual structures or not. Further the relative location of the control element 14, the actuator 12 and the sensor 18 may be swapped and still provide isolated signal transmission.

Figure 8:
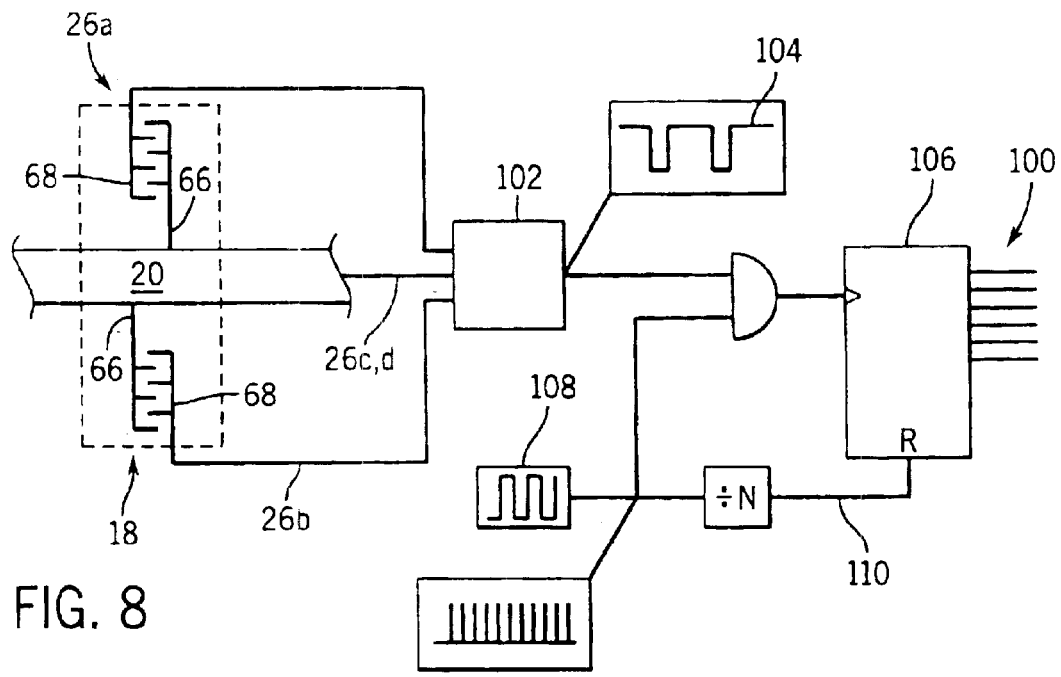
FIG. 8 is a detailed view of the sensor of FIG. 1 and its associated processing electronics for extracting a digital word from the isolator of the present invention.

Referring now to FIG. 8, a digital word output 100 can be obtained from the sensor 18 by making use of an error signal 31 resulting directly from a comparison of the capacitors of the sensor 18 by capacitive comparison circuit 102 of a type well known in the art. One such circuit for providing extremely accurate measurements of these capacitances in described in co-pending application Ser. No. 09/677,037 filed Sep. 29, 2000, hereby incorporated by reference. As so configured, the error signal 31 (when connected to the control element 14) will tend to restore the beam 20 to a null position dependent on the location where the values of the capacitors of the sensor 18 change their relationship of which is greater than the other. The output of the capacitive comparison circuit 102 will generally be a duty cycle modulated square wave 104 produced as the beam 20 wanders back and forth across the null point under the influences of the actuation force and the restoring force. The beam 20 provides an inertial averaging of the error signal 31 so that its average force is proportional to the actuation force. Counter 106 measures the percentage of time that the error signal 31 is in the high state. In one embodiment, the output of the capacitive comparison circuit 102 may be logically ANDed with a high rate clock signal to cause the counter 106 to count up during the time the error signal 31 is high and not otherwise. The counter may be reset periodically by a second time interval signal 110. The value on the counter 106 just prior to the resetting will be proportional to the duty cycle of the error signal 31 and therefore to the actuation signal. The frequency of the clock signal 108 and the period of the time interval signal 110 may be selected according to the desired resolution in the digital word output 100 according to methods well known in the art.

Referring again to FIG. 2, MEMS fabrication allows that a portion of the substrate 42 may also include integrated circuits 73 having a number of solid-state devices such as may implement, for example, the capacitor sense circuitry described above. A number of the MEMS analog isolators 10 may be placed on a single integrated circuit with appropriate interconnects made for providing them with the currents required. Generally, using the MEMS analog isolator 10 of the present invention, a single integrated circuit of arbitrary complexity, such as an industrial controller, may include isolators on the same substrate 42 manufactured concurrently with each other. These MEMS analog isolators 10 may provide for either inputs to the remaining integrated circuitry in the form of a digital word or, through the use of an on-board digital to analog converter, isolated analog outputs from the integrated circuit 73.

It is specifically intended that the present invention not be limited to the embodiments and illustrations contained herein, but that modified forms of those embodiments including portions of the embodiments and combinations of elements of different embodiments also be included as come within the scope of the following claims.

We claim:

1. A microelectromechanical system (MEMS) analog isolator, comprising:

a substrate;

an element supported from the substrate for movement between a first and second position with respect to the substrate, where at least a portion of the element between a first and second location on the element is an electrical insulator to electrically isolate the first and second locations from each other;

an actuator attached to the first location on the element to receive an input electrical signal and exert a force dependent on the input electrical signal urging the element toward the second position;

a control element attached to the element to exert a force dependent on the displacement of the element toward one of the first position and the second position; and a sensor assembly communicating with the second location on the element to provide an output electrical signal dependent on movement of the element between the first position and the second position.

2. The MEMS analog isolator of claim 1 wherein the control element is a spring and the sensor assembly includes a sensor providing the analog output electrical signal.

3. The MEMS analog isolator of claim 1 wherein the control element is a second actuator attached to the element to receive a feedback electrical signal and exert a force dependent on the feedback electrical signal urging the element toward the first position; and including wherein the sensor assembly including a sensor indicating a location of the element with respect to a null position and an error detector receiving the output electrical signal to generate the feedback electrical signal so as to tend to restore the element to the null position and wherein the output electrical signal is derived from the feedback signal.

4. The MEMS analog isolator of claim 1 wherein the control element further includes a third actuator attached to the element to receive a second feedback signal and exert a force dependent on the second feedback electrical signal urging the element toward the second position;

whereby more complex feedback control of the element may be accomplished.

5. The MEMS analog isolator of claim 3 wherein the error detector produces a binary electrical feedback indicating a position of the beam with respect to a null location between the first and second positions and further including a pulse width demodulator circuit evaluating the duty cycle of the feedback signal to produce the output electrical signal.

6. The MEMS analog isolator of claim 1 wherein the actuator is selected from the group consisting of: an electrostatic motor, a Lorenz-force motor, a piezoelectric motor, a thermal-expansion motor, and a mechanical-displacement motor.

7. The MEMS analog isolator of claim 1 wherein the control element is selected from the group consisting of: an electrostatic motor, a Lorenz-force motor, a piezoelectric motor, a thermal-expansion motor, a mechanical-displacement motor, and a mechanical spring.

8. The MEMS analog isolator of claim 1 wherein the sensor is selected from the group consisting of a capacitive sensor, a piezoelectric sensor, a photoelectric sensor, a resistive sensor, or an optical switching sensor.

9. The MEMS analog isolator of claim 1 wherein the element is a beam attached to the substrate for sliding motion between the first and second positions.

10. The MEMS analog isolator of claim 8 wherein the beam moves with respect to the substrate along a longitudinal axis and including flexing transverse arm pairs attached at longitudinally opposed ends of the beam to extend outward therefrom to support the beam with respect to the substrate.

11. The MEMS analog isolator of claim 9 wherein the flexing transverse arms attached to the substrate at points proximate to the beam and where the flexing transverse arms include:

(i) cantilevered first portions having first ends attached to the beam and second ends attached to an elbow portion removed from the beam; and (ii) cantilevered second portions substantially parallel to the first portions and having first ends attached to the substrate and second ends attached to the elbow portion;

whereby expansion of the first portion is offset by substantially equal expansion of the second portion so that the amount of stress in the beam can be controlled.

12. The MEMS analog isolator of claim 9 wherein the flexing transverse arms attach to the substrate through a spring section allowing angulation of the end of the transverse arm with respect to the substrate.

13. The MEMS analog isolator of claim 9 wherein the beam and transverse arms are symmetric across a longitudinal axis.

14. The MEMS analog isolator of claim 9 including further a magnetic field crossing the beam and wherein at least one flexing transverse arm pair is conductive to receive an electrical signal and exert a force dependent on the electrical signal urging the beam toward one of the first and second positions.

15. The MEMS analog isolator of claim 9 including transverse extending primary capacitor plates attached to the beam and extending outward from the beam proximate to secondary capacitor plates.

16. The MEMS analog isolator of claim 14 wherein an effective area of the primary capacitor plates is equal across the longitudinal axis of the beam.

17. The MEMS analog isolator of claim 14 wherein the capacitor plates attach to the beam between the attachment points of at least two of the flexing transverse arm pairs.

18. The MEMS analog isolator of claim 14 wherein the primary capacitor plates are positioned with respect to the secondary capacitor plates so as to draw the primary capacitor plates toward the secondary capacitor plates on one side of the beam while to separate the primary capacitor plates from the secondary capacitor plates on the other side of the beam with a given motion.

19. The MEMS analog isolator of claim 14 wherein the primary capacitor plates are positioned with respect to the secondary capacitor plates so as to draw the primary capacitor plates toward the secondary capacitor plates on both sides of the beam with a given motion.

20. The MEMS analog isolator of claim 1 wherein the beam includes first and second micro-machined layers, the first of which is insulating to provide the portion of electrical insulator in a region where the second layer is removed.

21. The MEMS analog isolator of claim 1 wherein the portion of electrical insulator of the beam is between the actuator and the controlling device.

22. The MEMS analog isolator of claim 1 wherein the portion of electrical insulator of the beam is between the controlling device and the sensor.

23. The MEMS analog isolator of claim 1 including further a second sensor at the first portion of the element to provide a second output electrical signal indicating movement of the element to the second position, the second output electrical signal being electrically isolated from the output electrical signal.

24. The MEMS analog isolator of claim 23 including further a second actuator at the second portion of the element to receive a second input electrical signal and exert a force dependent on the second input electrical signal urging the element toward the second position.

25. An isolated circuit module comprising:

a substrate;

a plurality of interconnected solid-state electronic devices formed on the substrate into an integrated circuit having analog input and output points;

a mechanical analog isolator also formed on the substrate and electrically attached to at least one of the integrated circuit input and output points, the mechanical analog isolator including:

a substrate;

an element supported from the substrate for movement between a first and second position with respect to the substrate, where at least a portion of the element between a first and second location on the element is an electrical insulator to electrically isolate the first and second locations from each other;

an actuator attached to the first location on the element to receive an input electrical signal and exert a force dependent on the input electrical signal urging the element toward the second position;

a control element attached to the element to exert a force dependent on the displacement of the element toward the first position;

a sensor assembly communicating with the second location on the element to provide an output electrical signal dependent on movement of the element between the first and second positions.

26. The isolated circuit module of claim 25 wherein the actuator of the mechanical analog isolator is attached to at least one output point of the integrated circuit whereby the output electrical signal provides an isolated output for the at least one output point.

27. The isolated circuit module of claim 25 wherein the sensor of the mechanical analog isolator is attached to at least one input point of the integrated circuit whereby the output electrical signal provides an isolated input to at least one output point.

* * * * *